United States Patent

Kikuchi et al.

[11] Patent Number: 5,149,993
[45] Date of Patent: Sep. 22, 1992

[54] CIRCUIT ARRANGEMENT OF SEMICONDUCTOR INTEGRATED CIRCUIT DEVICE

[75] Inventors: Hideo Kikuchi; Tetsu Tanizawa, both of Kawasaki, Japan

[73] Assignee: Fujitsu Limited, Kawasaki, Japan

[21] Appl. No.: 599,595

[22] Filed: Oct. 11, 1990

[30] Foreign Application Priority Data

Oct. 13, 1989 [JP] Japan .................................. 1-266661

[51] Int. Cl.[5] .......................................... H01L 25/00
[52] U.S. Cl. ............................ 307/465.1; 307/465; 307/443; 365/189.08
[58] Field of Search ................. 307/465, 465.1, 303.1; 365/189.08

[56] References Cited

U.S. PATENT DOCUMENTS

| | | | |
|---|---|---|---|
| 4,600,995 | 7/1986 | Kinoshita | 307/465.1 |
| 4,876,466 | 10/1989 | Kondou et al. | 307/465 |
| 4,920,515 | 4/1990 | Obata | 307/465 |

Primary Examiner—David Hudspeth
Assistant Examiner—Andrew Sanders
Attorney, Agent, or Firm—Nikaido, Marmelstein, Murray & Oram

[57] ABSTRACT

A circuit arrangement of a semiconductor integrated circuit device includes logic cell arrays arranged into columns. Each of the logic cell arrays have a plurality of logic cells. Each of the logic cells have at least one monitor point. The circuit arrangement also includes select lines which carry select signals, each specifying a corresponding one of the logic cells arrays. Further, the circuit arrangement includes read lines carrying monitor signals showing logic states of monitor points of the logic cells. The select lines and the read lines are provided so that the total number of the select lines and read lines is less than the sum total of the number of the logic cell arrays and a maximum number of monitor points contained in one of the logic cell arrays. Switch elements connect the monitor points of the logic cells to the read lines in response to the select signals.

18 Claims, 19 Drawing Sheets

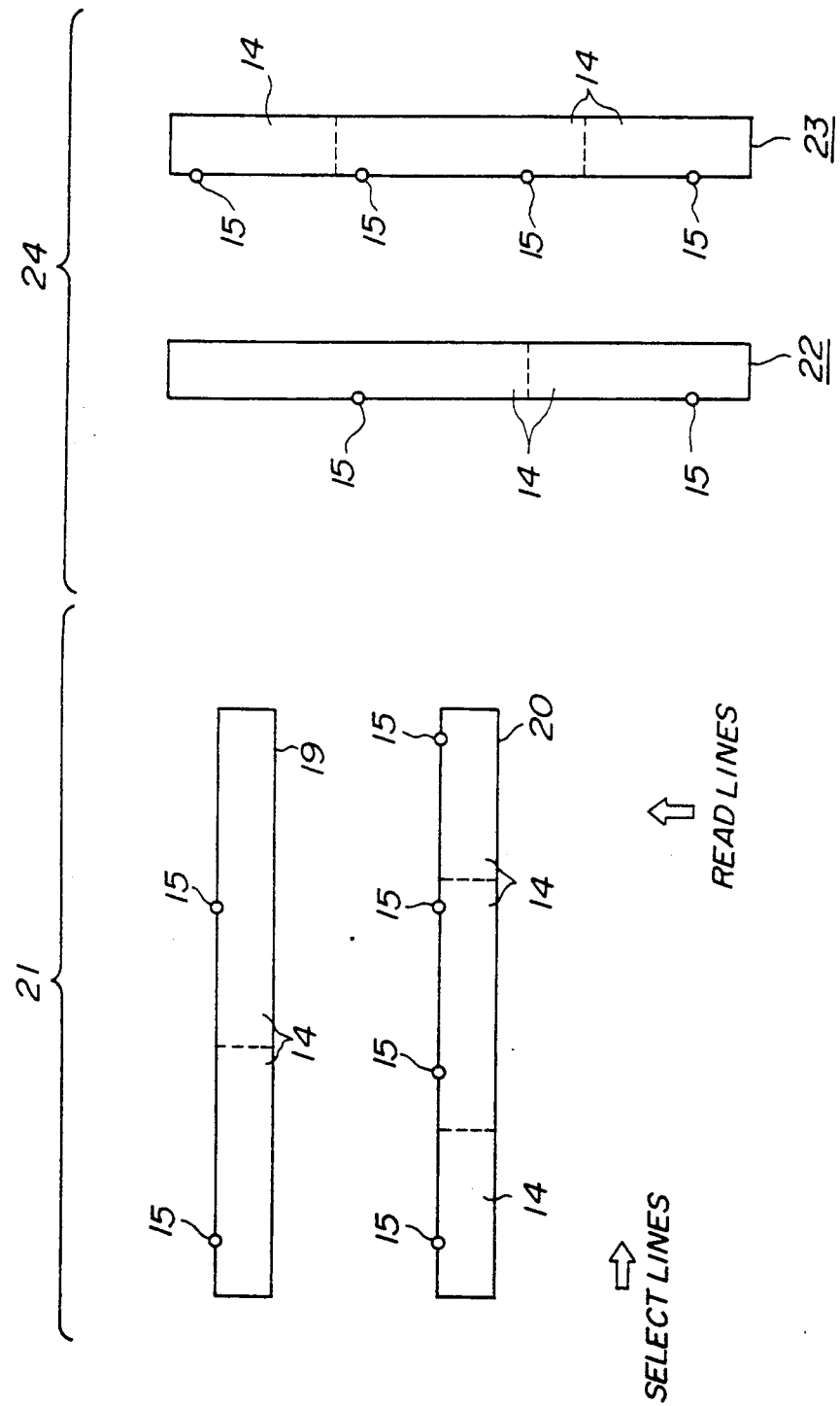

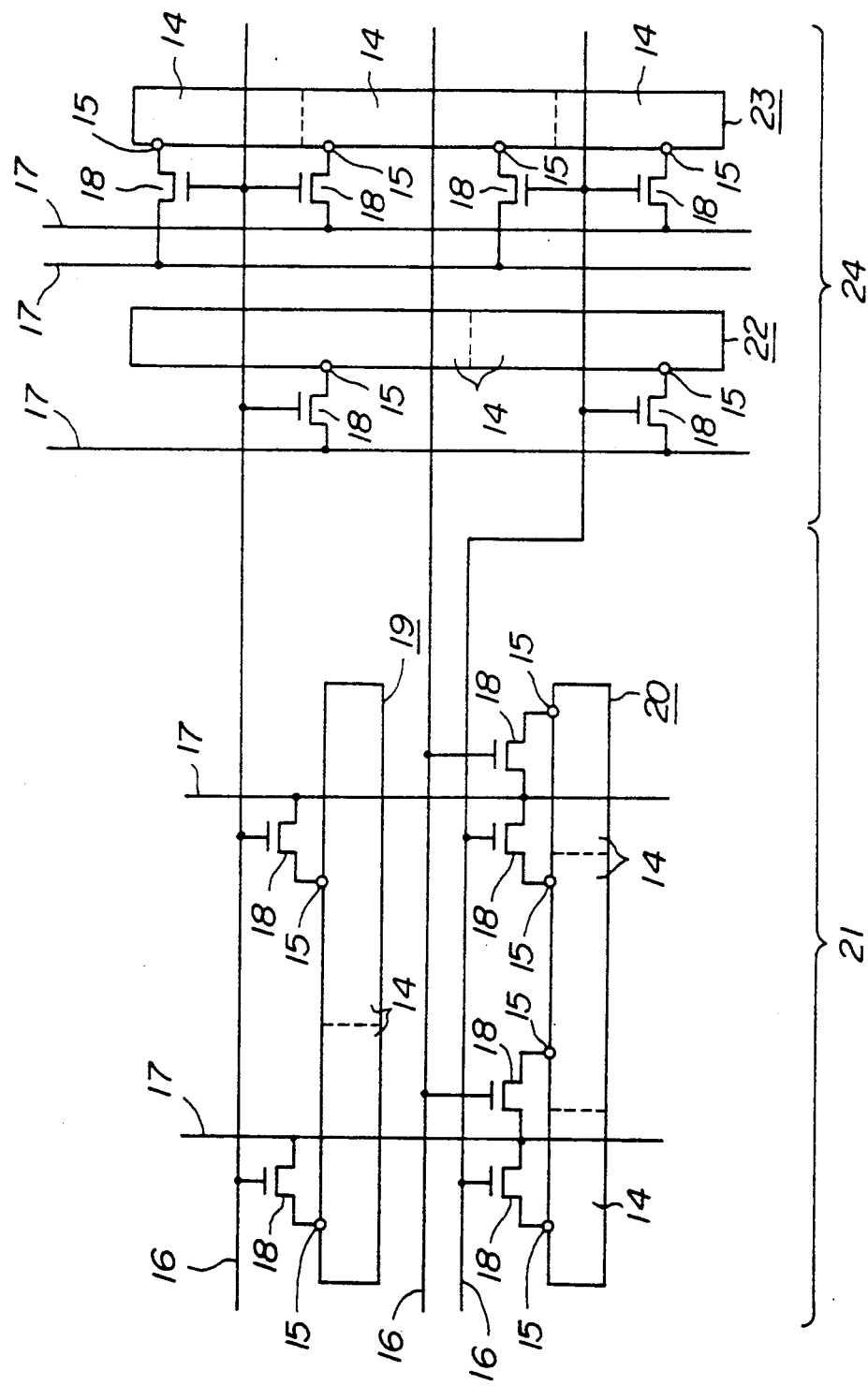

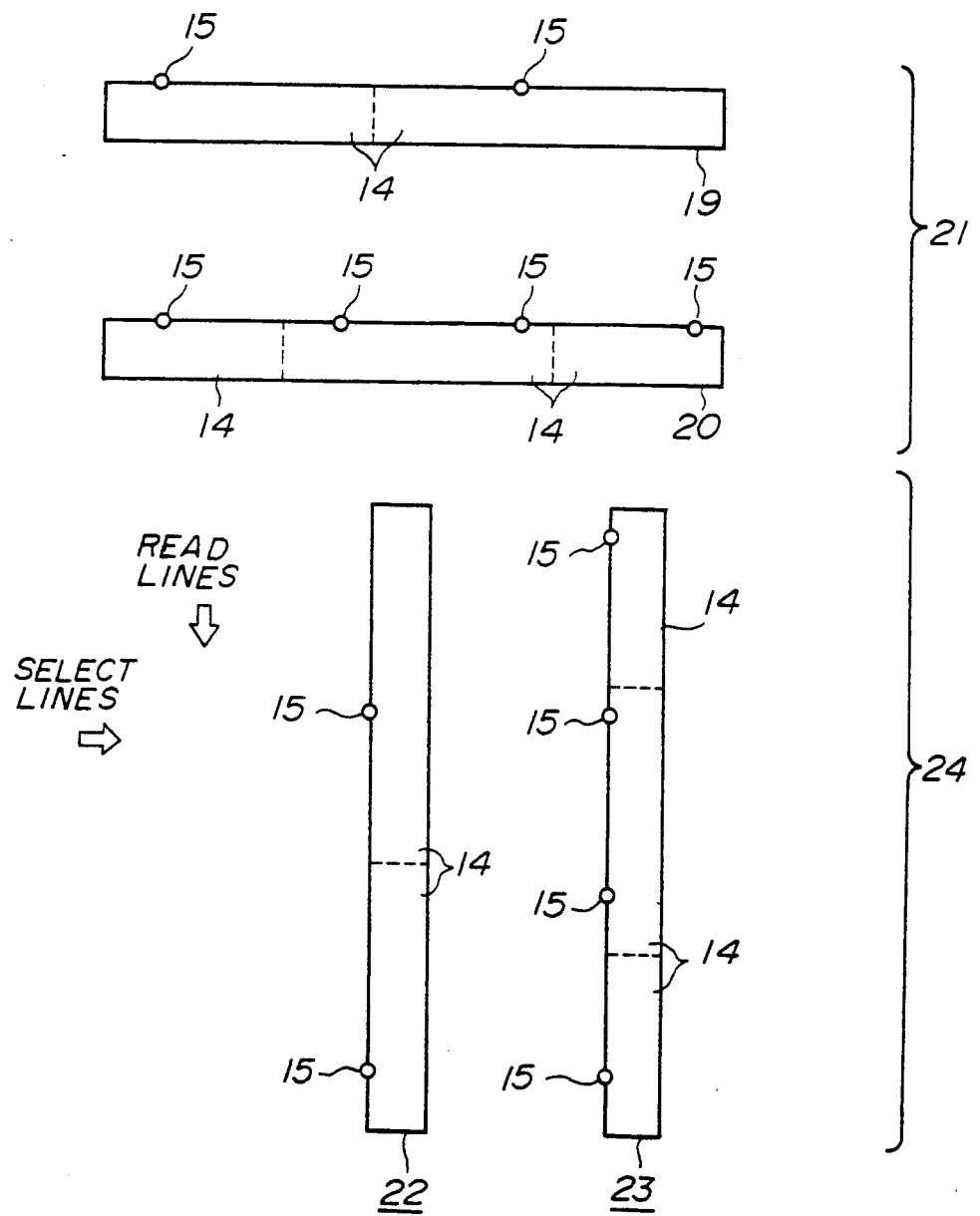

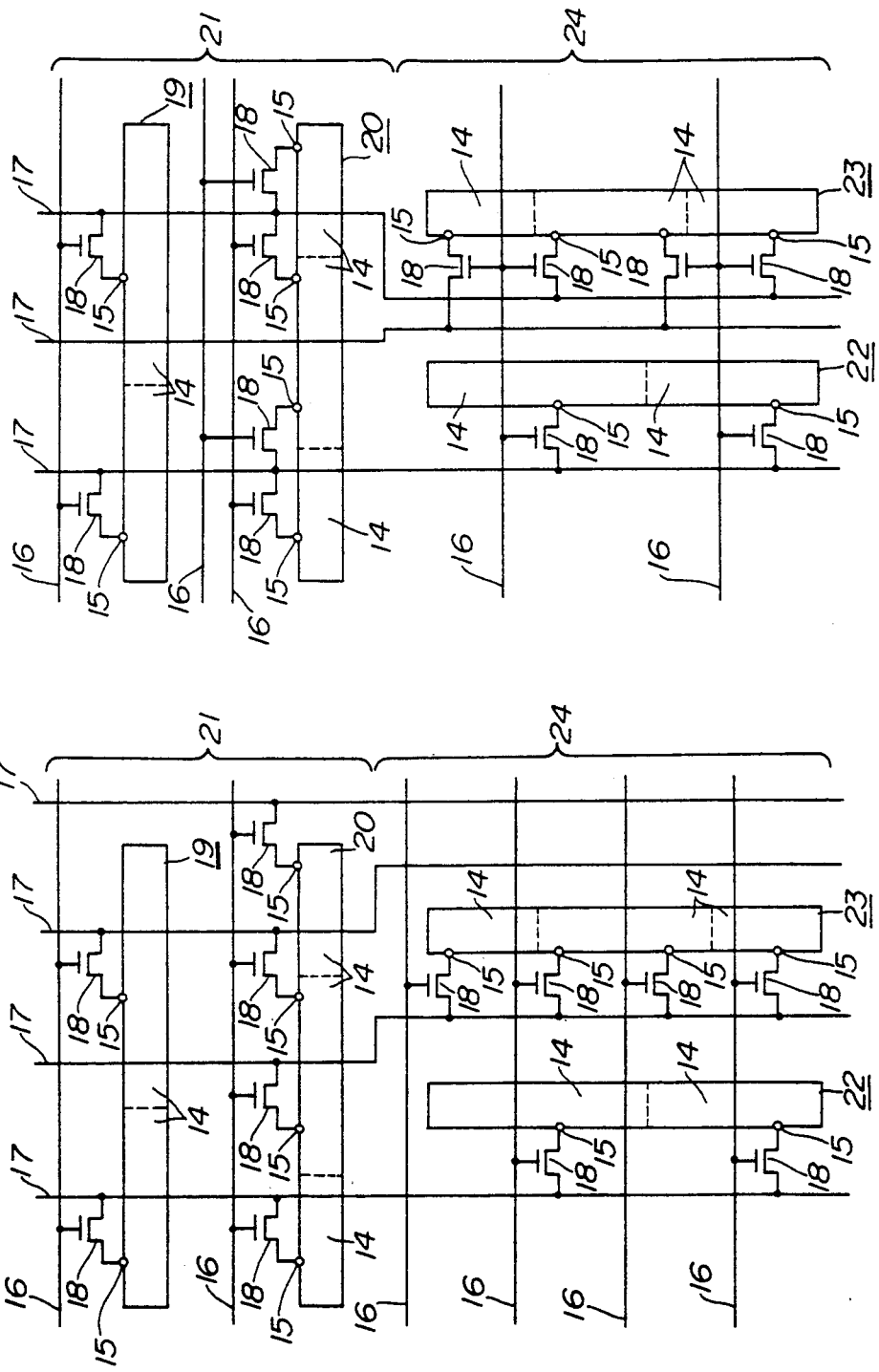

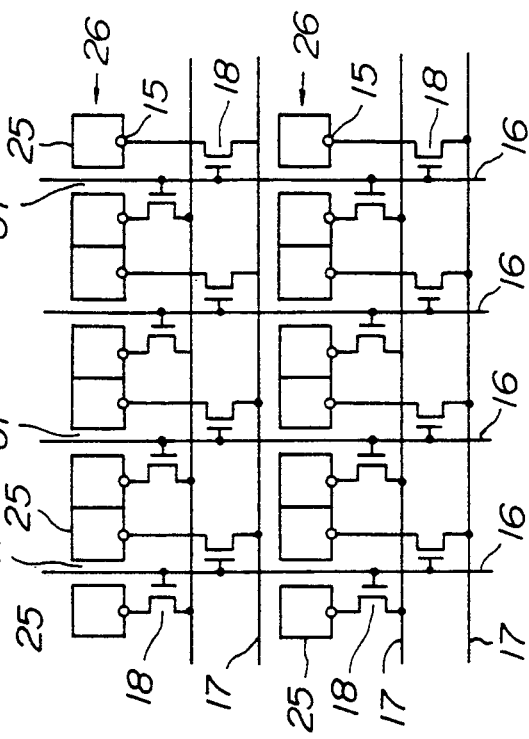
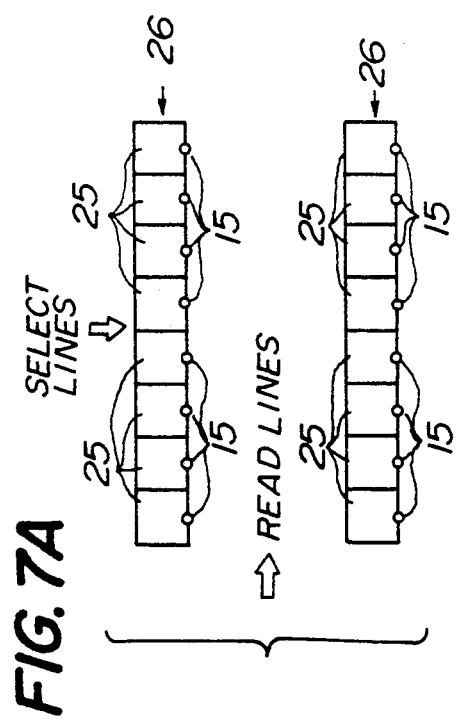
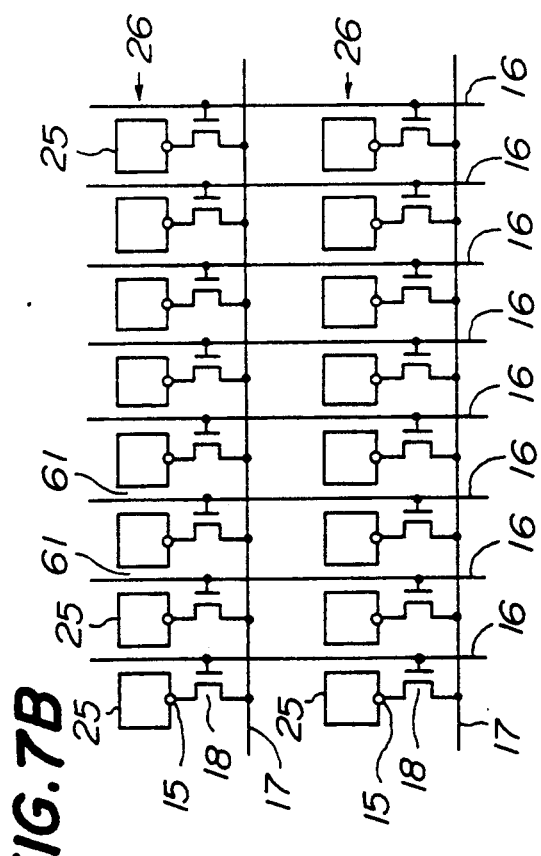

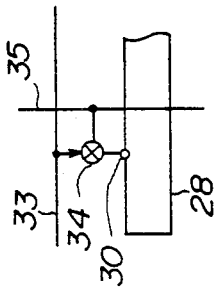
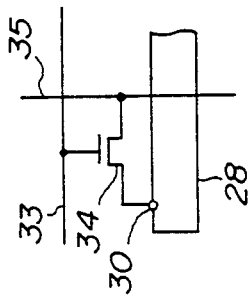
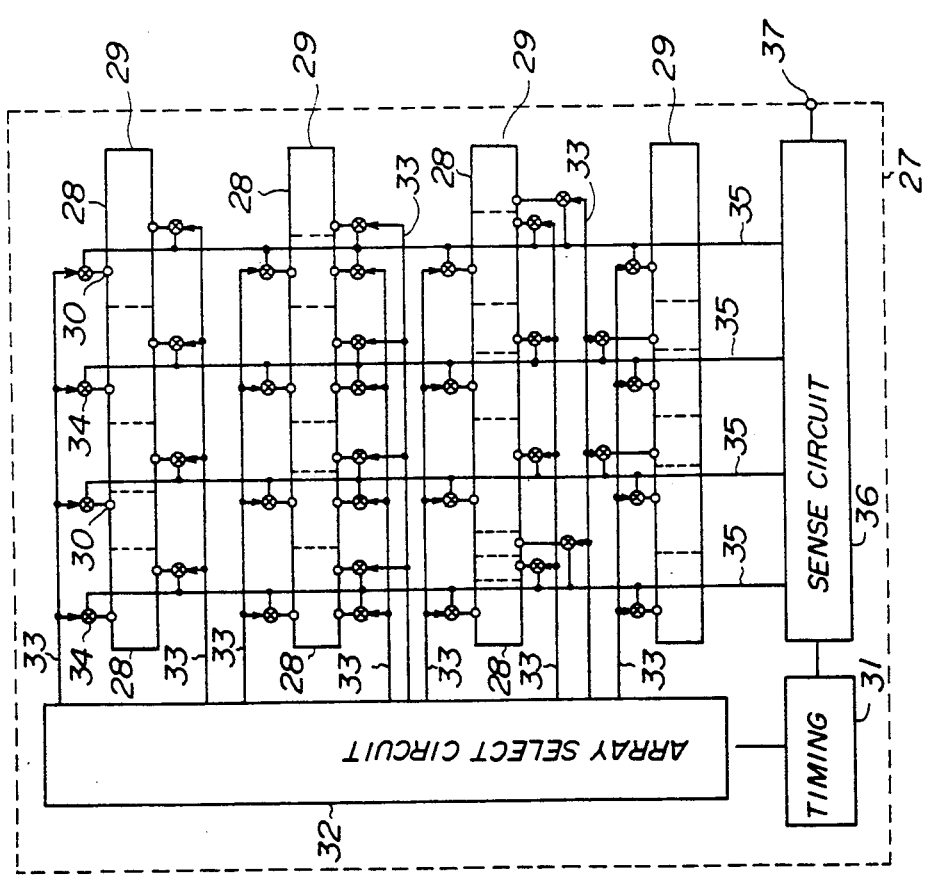

FIG. 16A
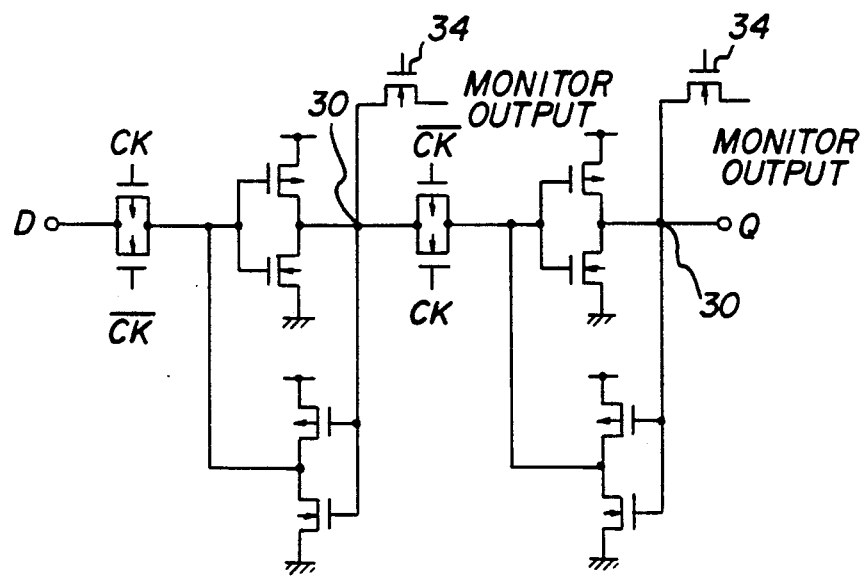
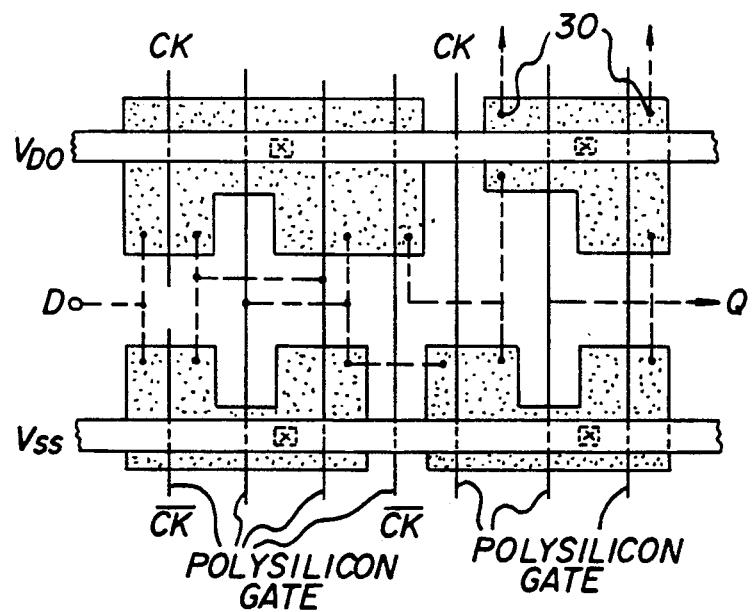
FIG. 16B

CIRCUIT ARRANGEMENT OF SEMICONDUCTOR INTEGRATED CIRCUIT DEVICE

BACKGROUND OF THE INVENTION

The present invention generally relates to a circuit arrangement of a semiconductor integrated circuit device, and more particularly to improvements in circuit arrangements of a semiconductor integrated circuit device, such as a gate array device or a standard cell device, suitable for a matrix probing test.

There is known a semiconductor integrated circuit device called a logic LSI of a plurality of column shaped logic cell arrays, each having logic cells arranged into columns. One or more monitor points are provided in each of the logic cells. The logic cells are mutually coupled by interconnection lines to thereby provide desired logic circuits. There is also known a logic LSIs having column shaped basic cell arrays, each having a plurality of basic cells.

The recent advance of fabricating such logic LSIs makes it possible to provide a drastically increased number of logic cells arranged in one chip. Currently, it is possible to arrange logic LSIs having tens to hundreds of thousands of logic cells on a single chip. As an increased number of logic cells is provided, it becomes difficult to test logic LSIs. In order to test logic LSIs effectively and efficiently, there is proposed a logic LSI having a built-in test circuit. Normally, a test circuit built in a logic LSI is used for carrying out a good/fail judgment of internal circuits, debugging of logic design and analysis of faults. The above-mentioned situations hold true for logic LSIs having column shaped basic cell arrays.

Japanese Laid-Open Patent Application No. 61-42934 proposes a semiconductor integrated circuit device having a built-in test circuit. Referring to FIG. 1, there is illustrated the outline of the proposed device. A plurality of logic cells 2 are formed on a semiconductor chip 1. A built-in test circuit is composed of row select lines 3, column read lines 4, switch elements 5, a row select ring counter 6, a column select ring counter 7, a data selector 8, a row select clock input terminal 9, a column select clock input terminal 10 and a monitor output terminal 11. The logic cells 2 are interconnected on the basis of a user's design or specification in order to provide desired logic circuits. For the sake of simplicity, such interconnections are not illustrated in FIG. 1.

Output terminals of the logic cells 2 are connected to the column read lines 4 via the switch elements 5. The row select ring counter 6 selects one of the row select lines 3, and the column select ring counter 7 selects one of the column select lines 3, so that the logic cells 2 are selected one by one. The logic state of the output terminal of a selected logic cell 2 is output to the monitor output terminal 11 via the data selector 8. In this way, information about the states of the output terminals of the logic cells 2 is obtained at the monitor output terminal 11 and used for determining whether or not desired logic circuits operate correctly.

The above-mentioned test method is called a matrix proving method or simply an MP method. According to the matrix probing method, it is possible to read out the logic state of each logic cell 2. Thus, it is possible to design logic circuits easily, as compared with a conventional scan path method which uses flip-flops. In addition, the reliability of the matrix probing method is high.

In conventional logic LSIs as described above, the row select lines 3 are provided for the respective rows, and the column read lines 4 are provided for the respective columns. This causes a problem in that the wiring lines are not arranged efficiently and sometimes prevents the formation of the interconnection lines. Another problem arises from the fact that each of the rows has the same number of logic cells, each having one monitor point. Thus, the arrangement shown in FIG. 1 is not applied directly to a standard cell array device having various column shaped logic cell arrays in which one or more different types of logic cells having different areas are arranged and one or more monitor points are provided in the respective logic cell arrays. In order to fabricate such a standard cell array device on the basis of the concept of the arrangement shown in FIG. 1, it is necessary to provide a number of column read lines equal to a number of monitor points contained in one of the logic cell arrays having a maximum number of monitor points. This needs a large number of column read lines and makes it difficult to design the layout of interconnection lines for coupling the logic cells.

SUMMARY OF THE INVENTION

It is a general object of the present invention to provide an improved circuit arrangement of a semiconductor integrated circuit device in which the aforementioned disadvantages are eliminated.

A more specific object of the present invention is to provide a circuit arrangement of a semiconductor integrated circuit device in which a reduced total number of select lines and read lines is provided, and thus interconnection lines can be routed efficiently without being affected by the existence of lines provided for executing a matrix probing test.

The above-mentioned objects of the present invention are achieved by a circuit arrangement of a semiconductor integrated circuit device comprising: logic cell arrays arranged into columns, each of the logic cell arrays having a plurality of logic cells, each of the logic cells having at least one monitor point; select lines carrying select signals, each specifying a corresponding one of the logic cell arrays; read lines carrying monitor signals showing logic states of monitor points of the logic cells, the select lines and the read lines being provided so that the total number of the select lines and read lines is less than the sum total of the number of the logic cell arrays and a maximum number of monitor points contained in one of the logic cell arrays; and switch elements connecting the monitor points of the logic cells to the read lines in response to the select signals.

The aforementioned objects of the present invention are also achieved by a circuit arrangement of a semiconductor integrated circuit device comprising: a first group of logic cell arrays arranged into columns, each of the logic cell arrays running in a first direction; a second group of logic cell arrays arranged into columns, each of the logic cell arrays of the second groups running in a second direction perpendicular to the first direction, the first and second groups being positioned side by side in one of the first and second directions, each of the logic arrays of the first and second groups having a plurality of logic cells, and each of the logic cells having at least one monitor point; a first group of select lines provided for the first group of logic cell arrays, the select lines carrying select signals, each specifying a corresponding one of the logic cell arrays, the number of select lines of the first group being larger than the number of the logic cell arrays of the first group; and a first group of read lines provided for the first group of logic cell arrays, the read lines of the first group carrying monitor signals showing logic states of monitor points of the logic cells of the first group of logic cell arrays. The circuit arrangement also comprises a second group of select lines provided for the second group of logic cell arrays, the read lines of the second group carrying select signals, each specifying a corresponding one of the logic cell arrays of the second group; a second group of read lines provided for the second group of logic cell arrays, the read lines of the second group carrying monitor signals showing logic states of monitor points of the logic cells of the second group of logic cell arrays, the number of the read lines of the second group being larger than that of the logic cell arrays of the second group; a first group of switch elements connecting the monitor points of the logic cells of the first group of logic cell arrays to the first group of read lines in response to the select signals carried by the first group of select lines; and a second group of switch elements connecting the monitor points of the logic cells of the second group of logic cell arrays to the second group of read lines in response to the select signals carried by the second group of select lines.

The aforementioned objects of the present invention are also achieved by a circuit arrangement of a semiconductor integrated circuit device, comprising: basic cell arrays arranged into columns, each basic cell arrays having a plurality of basic cells, each of the basic cells having one monitor point, and each of the basic cells having an identical pattern; a plurality of select lines respectively provided for each of the basic cell arrays and carrying select signals for specifying a corresponding one of the basic cell arrays; read lines carrying monitor signals showing logic states of monitor points of the basic cells; and switch elements connecting the monitor points of the basic cells to the read lines in response to the select signals.

BRIEF DESCRIPTION OF THE DRAWINGS

Other objects, features and advantages of the present invention will become more apparent from the following detailed description when read in conjunction with the accompanying drawings, in which:

FIGS. 4A, 4B and 4C are diagrams illustrating a conceivable arrangement and an improved arrangement according to a third preferred embodiment of the present invention;

FIGS. 5A, 5B and 5C are diagrams illustrating a conceivable arrangement and a variation of the arrangement shown in FIGS. 4C;

FIGS. 7A, 7B and 7C are diagrams illustrating a conceivable arrangement and an improved arrangement according to a fifth preferred embodiment of the present invention;

FIG. 8 is a block diagram illustrating the entire structure of the first preferred embodiment of the present invention;

FIGS. 9A and 9B are diagrams illustrating the relationship between a special symbol used in FIG. 8 and a corresponding circuit configuration;

FIG. 16A and 16B are diagrams illustrating another example of the logic cell used in the embodiments of the present invention;

DESCRIPTION OF THE PREFERRED EMBODIMENTS

Figure 1:
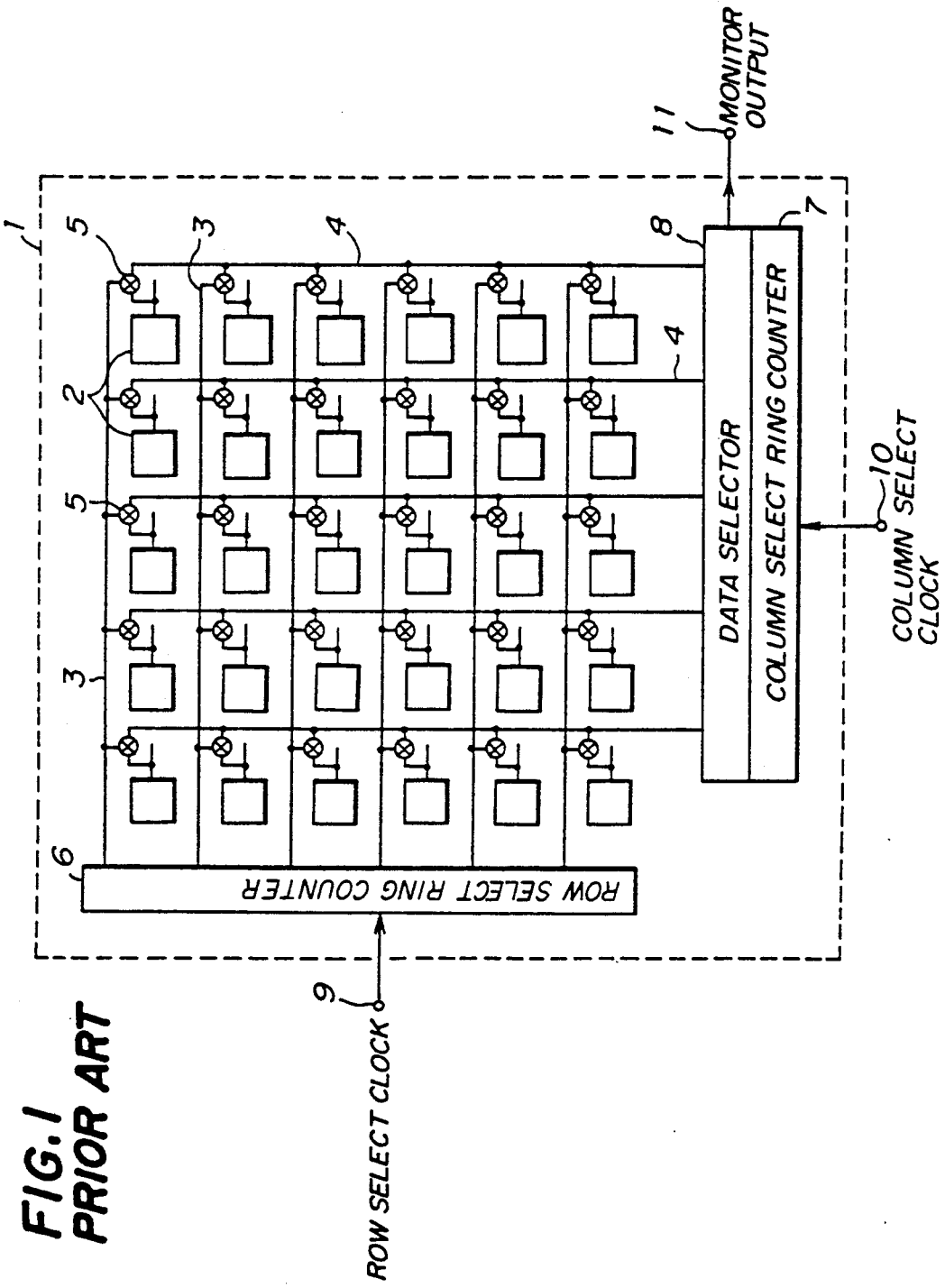
FIG. 1 is a block diagram illustrating a conventional semiconductor integrated circuit device having a test circuit.

A description will now be given of a first preferred embodiment of the present invention with reference to FIGS. 2A, 2B and 2C. Referring to FIG. 2A, two column shaped logic cell arrays 12 and 13 are arranged in columns. Each of the logic cell arrays 12 and 13 is composed of a plurality of logic cells 14. A logic cell is defined as a unit circuit which provides a logic function by itself and which is used for forming a logic circuit. Examples of the logic cell are a NOT circuit, AND circuit, OR circuit, composite gate circuit, adder circuit, decode circuit, latch circuit, flip-flop, shift register and counter.

The logic cell array 12 has two logic cells 14, and the logic cell array 13 has four logic cells 14. The logic cell array 12 has two monitor points 15, and the logic cell array 13 has four monitor points 15. Select lines run in parallel with the logic cell arrays 12 and 13, and read lines run in the direction perpendicular to the direction in which the logic cell arrays 12 and 13 run.

Figure 2C:
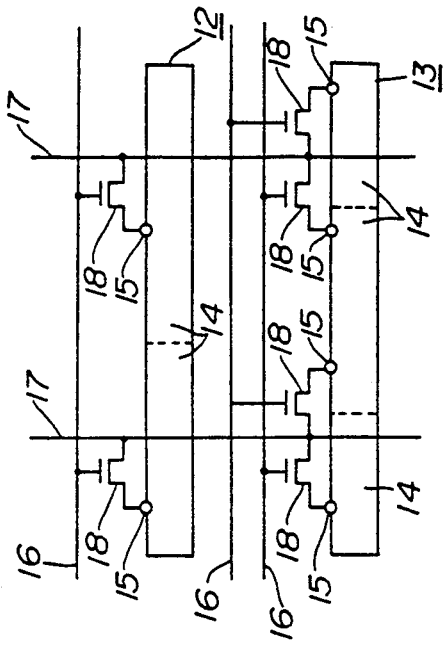
FIGS. 2A, 2B and 2C are diagrams illustrating a conventional arrangement and an improved arrangement according to a first preferred embodiment of the present invention.
Figure 2A:
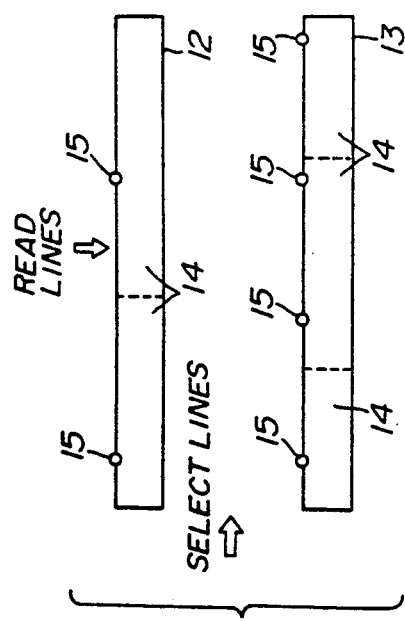
Figure 2B:
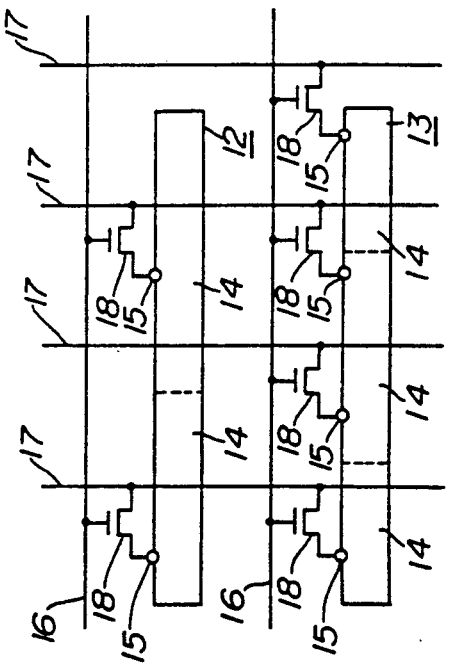

Referring to FIG. 2B, there is illustrated a conventional structure which realizes the arrangement shown in FIG. 2A. In FIG. 2B, two select lines 16 and four read lines 17 are provided with respect to the logic cell arrays 12 and 13 which are adjacent to each other. More specifically, the two select lines 16 are provided for the respective logic cell arrays 12 and 13. There is provided the same number of read lines 17 as that of the monitor points 15 of the logic cell array 13 which is larger than that of the logic cell array 12. Switch elements 18 formed of n-channel field effect transistors are respectively provided between the respective monitor points 15 and the corresponding read lines 17. That is, two switch elements 18 are provided for the logic cell array 12, and four switch elements 18 are provided for the logic cell array 13. It is possible to use p-channel field effect transistors or bipolar transistors in place of the n-channel field effect transistors. Hereinafter, field effect transistors are simply referred to as MOS transistors.

Referring to FIG. 2C, there is illustrated a corresponding arrangement according to the first preferred embodiment of the present invention. According to the first preferred embodiment of the present invention, a number of select lines 16 larger than that of logic cell arrays 12 and 13 is provided. In FIG. 2C, three select lines 16 are provided for the two logic cell arrays 12 and 13. More specifically, one select line 16 is provided for the logic cell array 12, and two select lines 16 are provided for the logic cell array 13. In general number of select lines is equal to the number of monitor points connected to the one read line, (i.e., in FIG. 2C), the number of select lines 16 for each of the logic cell arrays is half (i.e., because two read lines) the number of monitor points 15 of a corresponding one of the logic cell arrays or its nearest whole number (i.e., two read lines per number of monitor points). The number of read lines related to one array is obtained by dividing the total number of monitor points by the number of monitor points connected to one read line, i.e., in FIG. 2C, the total number of read lines 17 is half (i.e., because two monitor points per read line) the maximum number of monitor points or its nearest whole number. As a result, it is sufficient to provide two read lines 17. The sum total of the number of select lines 16 and the number of read lines 17 is one less than that for the conventional arrangement shown in FIG. 2B.

Two MOS transistors 18 located on the left side of the logic cell array 13 have drains connected to the respective monitor points 15, sources connected to the corresponding read line 17, and gates connected to the respective select lines 16.

As described above, according to the first preferred embodiment of the present invention, it becomes possible to obtain the sum total of the number of select lines 16 and the number of read lines 17 which is less than the conventional arrangement (i.e., the sum total of the number of select lines 16 in the conventional arrangement is equal to that of logic cell arrays and the number of read lines in the conventional arrangement is the number of monitor points of a logic cell array which has a maximum number of monitor points).

Figure 3A:
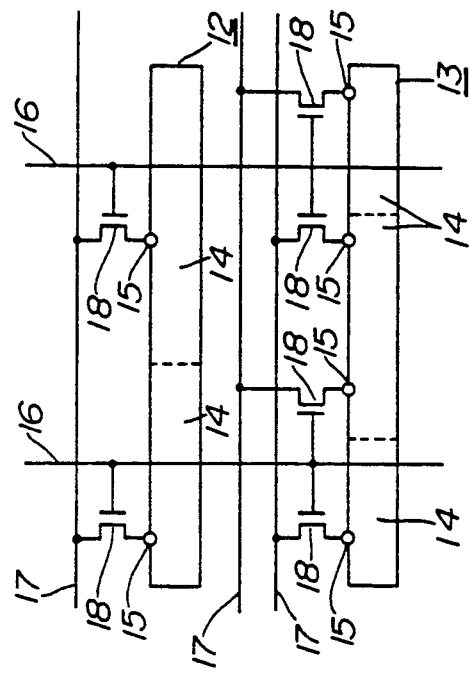
FIGS. 3A, 3B and 3C are diagrams illustrating a conventional arrangement and an improved arrangement according to a second preferred embodiment of the present invention.

A description will now be given of a second preferred embodiment of the present invention with reference to FIGS. 3A, 3B and 3C. In these figures, those parts which are the same as those shown in FIGS. 2A, 2B and 2C are given the same reference numerals. As shown in FIG. 3A, the second embodiment of the present invention has an arrangement in which read lines run in parallel with the logic cell arrays 12 and 13 and select lines run in the direction perpendicular to the direction perpendicular to the direction in which the logic cell arrays run.

Figure 3B:
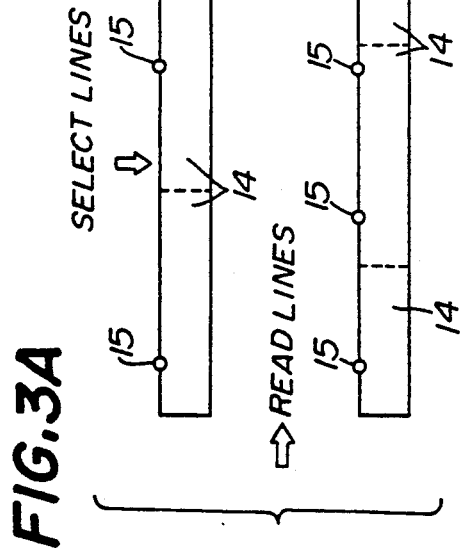

Referring to FIG. 3B, there is illustrated a conventional structure which realizes the arrangement shown in FIG. 3A. Two read lines 17 are provided for the respective column cell arrays 12 and 13, and four select lines 16 corresponding to the four monitor points of the logic cell array 13 are provided. The conventional arrangement needs a number of select lines 16 equal to a maximum number of monitor points contained one of the logic cell arrays, and a number of read lines 17 equal to the total number of the logic cell arrays 12 and 13.

Figure 3C:
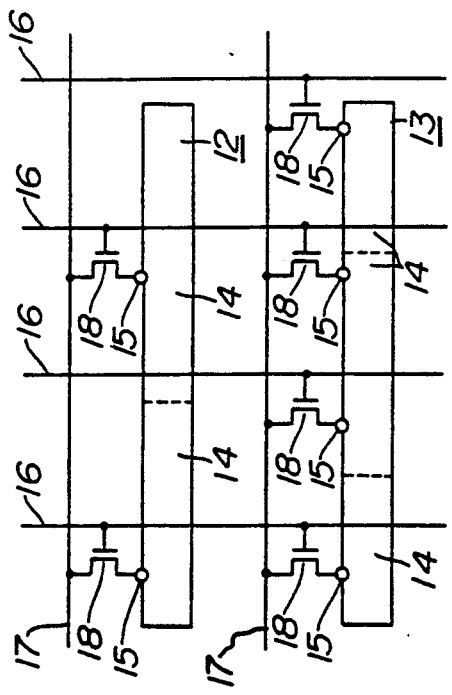

Referring to FIG. 3C, there is illustrated a corresponding arrangement according to the second preferred embodiment of the present invention. According to the second preferred embodiment, a number of read lines larger than that of logic cell arrays is provided. As shown in FIG. 3C, three read lines 17 are provided for the two logic cell arrays 12 and 13. More specifically, one read line 17 is provided for the logic cell array 12, and two read lines 17 are provided for the logic cell array 13. Two select lines 16 are provided for the logic cell arrays 12 and 13. The total number of read lines 17 and select lines 16 shown in FIG. 3C is equal to 5, and is one less than that of read lines 17 and select lines 16 shown in FIG. 3B. In general in FIG. 3C, the number of read lines 17 for each of the logic cell arrays is half the number of monitor points 15 of a corresponding one of the logic cell arrays or its nearest whole number, and the total number of select lines 16 is half the maximum number of monitor points 15 or its nearest whole number. In this manner, according to the second preferred embodiment of the present invention, it becomes possible to obtain the total number of select lines 16 and read lines 17 which is less than the conventional arrangement (i.e., the sum total of the number of select lines 16 in the conventional arrangement is equal to that of logic cell arrays and the number of read lines in the conventional arrangement is the number of monitor points of a logic cell array which has a maximum number of monitor points.

Two MOS transistors located on the left side of the logic cell array 13 have drains connected to the respective monitor points 15, sources connected to the respective read lines 17, and gates connected to the corresponding select line 16.

A description will now be given of a third preferred embodiment of the present invention with reference to FIGS. 4A, 4B and 4C. In these figures, those parts which are the same as those shown in the preceding figures are given the same reference numerals.

An arrangement shown in FIG. 4A has a first logic cell array group 21 composed of two logic cell arrays 19 and 20, and a second logic cell array group 24 composed of two logic cell arrays 22 and 23. The logic cell arrays 19 and 20 of the first group 21 run in the direction perpendicular to the direction in which the logic cell arrays 22 and 23 of the second group 24 run. Select lines run in parallel with the logic cell arrays 19 and 20, and read lines run in parallel with the logic cell arrays 22 and 23. The first and second groups 21 and 24 are located side by side in the direction in which the select lines run.

Figure 4B:
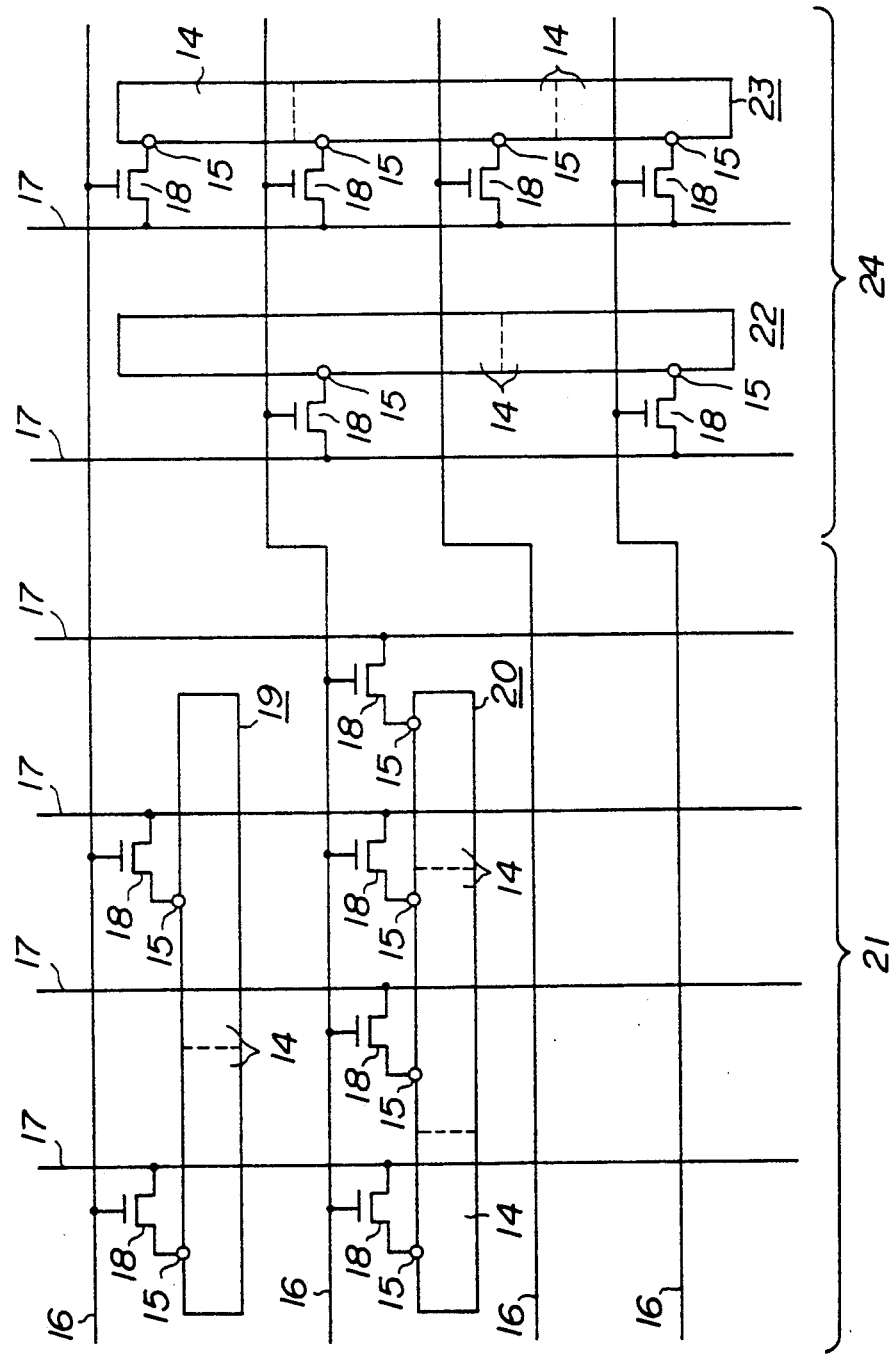

Referring to FIG. 4B, there is illustrated a conceivable structure which realizes the arrangement shown in FIG. 4A. The structure shown in FIG. 4B needs a number of select lines equal to a larger number out of the number of logic cell arrays of the first group 21 and the number of monitor points of a logic cell array of the second group 24 having a maximum number of monitor points. In the arrangement shown in FIG. 4A, the first group 21 has two logic cells 19 and 20, and the maximum number of monitor points related to the second group 24 is equal to 4. Thus, as shown in FIG. 4B, four select lines 16 are provided for the first and second groups 21 and 24. Further, the structure shown in FIG. 4B needs a number of read lines equal to the sum total of the number of monitor points of a logic cell array of the first group 21 having a maximum number of logic cells and the number of logic cell arrays of the second group 24. In the structure shown in FIG. 4A, the maximum number of monitor points related to the first group 21 is equal to 4, and the second group 24 has two logic cell arrays 22 and 23. Thus, as shown in FIG. 4B, six read lines 17 are provided.

Referring to FIG. 4C, there is illustrated a corresponding structure which realizes the arrangement shown in FIG. 4A according to the third preferred embodiment of the present invention. According to the third embodiment, select lines more than the logic cell arrays of the first group 21 are provided, and read lines more than the logic cell arrays of the second group 24 are provided. Two select lines 16 are provided for the logic cell array 20, and two read lines 17 are provided for the logic cell array 23. The arrangement shown in FIG. 4C has three select lines 16 and five read lines 17. That is, the total number of select lines 16 and read lines 17 shown in FIG. 4C is two less than that of select lines 16 and read lines 17 shown in FIG. 4B.

Two MOS transistors 18 located on the left side of the logic cell array 20 have drains connected to the respective monitor points 15, sources connected to the corresponding read line 17, and gates connected to the respective select lines 16. Two MOS transistors 18 located on the upper side of the logic cell array 23 have drains connected to the respective monitor points 15, sources connected to the respective read lines 17, and gates connected to the corresponding select line 16.

According to the third preferred embodiment, it becomes possible to obtain the total number of select lines 16 and read lines 17 which is two less than the total number of these lines shown in FIG. 4B.

A description will now be given of a variation of the third preferred embodiment of the present invention with reference to FIGS. 5A, 5B and 5C. As shown in FIG. 5A, the first and second groups 21 and 24 are located side by side in the direction in which the read lines 17 run.

Referring to FIG. 5B, there is illustrated a conceivable structure which realizes the arrangement shown in FIG. 5A. The arrangement shown in FIG. 5B has select lines 16 equal in number to the logic cell arrays 19 and 20 of the first group 21, and a number of select lines equal to the number of monitor points 15 of a logic cell array of the second group 24 having a maximum number of monitor points. In the arrangement shown in FIG. 5B, the logic cell array 23 has a maximum number of monitor points 15. Thus, the total number of read lines 17 is equal to 6. Further, the arrangement shown in FIG. 5B has four read lines 17 equal in number to monitor points 15 of the logic cell array 23 having the maximum number of monitor points. It will be noted that the total number of select lines 16 and read lines 17 shown in FIG. 5B is equal to 10.

Referring to FIG. 5C, there is illustrated a corresponding structure according to the variation of the third preferred embodiment of the present invention. The structure shown in FIG. 5C needs only five select lines 16 and three read lines 17. The total of select lines 16 and read lines 17 used in the structure shown in FIG. 5C is equal to 8, which is two less than that for the arrangement shown in FIG. 5B. More specifically, the first group 21 has (three) select lines 16 more than (two) logic cell arrays 19 and 20, and the second group 21 has (three) read lines 17 more than (two) logic cell arrays 22 and 23.

Two MOS transistors 18 located on the left side of the logic cell array 20 have drains connected to the respective monitor points 15, sources connected to the corresponding read line 17, and gates connected to the respective select lines 16. Two MOS transistors 18 on the upper side of the logic cell array 23 have drains connected to the respective monitor points 15, sources connected to the respective read lines 17, and gates connected to the corresponding select line 16.

A description will now be given of a fourth preferred embodiment of the present invention with reference to FIGS. 6A, 6B and 6C. Referring to FIG. 6, there are illustrated two base cell arrays 26, each having a plurality of basic cells 25. Each of the basic cells 25 has one monitor point 15. Select lines run in the direction in which the basic cell arrays 26 run, and read lines run in the direction perpendicular to the basic cell arrays 26. A basic cell is a unit composed of grouped transistors having an identical pattern.

Figure 6C:
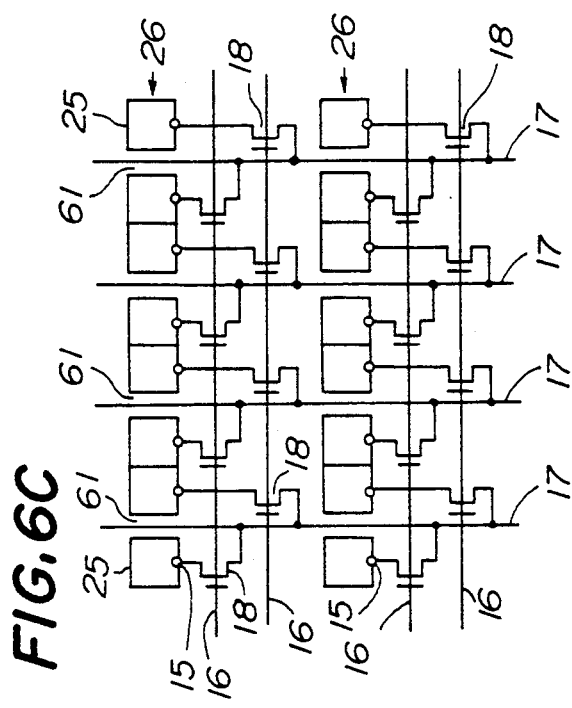
FIGS. 6A, 6B and 6C are diagrams illustrating a conceivable arrangement and an improved arrangement according to a fourth preferred embodiment of the present invention.
Figure 6A:
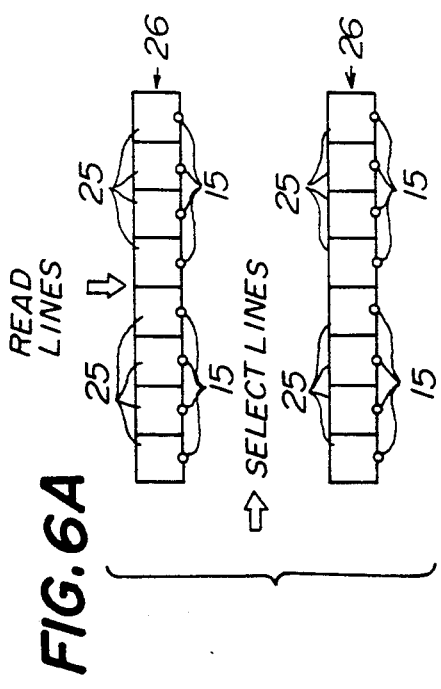
Figure 6B:
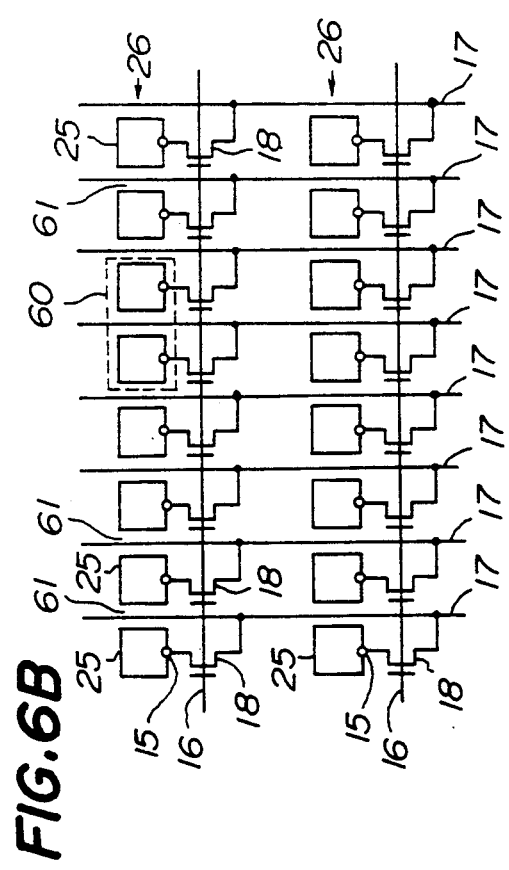

Referring to FIG. 6B, there is illustrated a conceivable structure which realizes the arrangement shown in FIG. 6A. Two select lines 16 are provided for the respective basic cell arrays 26, and read lines 17 are provided for the respective basic cells 25 of the basic cell arrays 26. Switch elements 18 formed of n-channel type MOS transistors are respectively provided between the monitor points 15 of the basic cells 25 and the read lines 17. The gates of the MOS transistors 18 are connected to the corresponding select lines 16. It will be noted that one select line 16 is provided for one basic cell array 26, and one read line 17 is provided for one basic cell 25. Thus, it is necessary to provide a wiring area 61 between the adjacent basic cells 25.

Referring to FIG. 6C, there is illustrated a corresponding structure according to the fourth preferred embodiment of the present invention. According to the fourth preferred embodiment of the present invention, a plurality of select lines are respectively provided for each of the basic cell arrays 26. In the arrangement shown in FIG. 6, two select lines 16 are provided for the respective basic cell arrays 26. On the other hand, one read line 17 is arranged for every group 60 (gate circuit) consisting of two adjacent basic cells 25. The two adjacent basic cells 25 are close to each other without having any wiring area, and the wiring area 61 is provided between the adjacent groups. Thus, the number of read lines 17 half the number of read lines 17 shown in FIG. 6B is sufficient to configure the arrangement shown in FIG. 6A. With the above-mentioned arrangement, it becomes possible to provide a reduced number of wiring areas 61.

The MOS transistor 18 provided for one of the two basic cells 25 of each group 60 has a drain connected to the corresponding monitor point 15, a source connected to a corresponding one of the two read lines 17 related to the group being considered, and a gate connected to one of the corresponding select lines 16. Further, the MOS transistor 18 provided for the other basic cell 25 of the same group 60 has a drain connected to the corresponding monitor point 15, a source connected to the other read line 17, and a gate connected to the other select line 16. It should be noted that the wiring area 61 shown in FIG. 6C has a length less than the sum total of lengths of two wiring areas 61 shown in FIG. 6B. It is also possible to provide the read lines 17 over the logic cells 14.

A description will now be given of a fifth preferred embodiment of the present invention with reference to FIGS. 7A, 7B and 7C. In these figures, those parts which are the same as those shown in the previous figures are given the same reference numerals. An arrangement shown in FIG. 7A has read lines which run in the direction in which the basic cell arrays 26 run, and select lines in the direction in which the basic cell arrays 26 are spaced apart from each other.

Referring to FIG. 7B, there is illustrated a conceivable structure which configures the arrangement shown in FIG. 7A. The two read lines 17 are respectively provided for each of the two basic cell arrays 26, and the select lines 16 are provided for the respective basic cells 25 of the basic cell arrays 26. The MOS transistors 18 are respectively provided between the read lines 17 and the basic cells 25. The gates of the MOS transistors 18 are connected to the corresponding select lines 16. The wiring areas 61 are respectively provided between adjacent basic cells 25.

Referring to FIG. 7C, there is illustrated a corresponding structure which realizes the arrangement shown in FIG. 7A according to the fifth preferred embodiment of the present invention. Two adjacent basic cells 25 are grouped to form the gate circuit 60, and one select line is arranged for every group. Two read lines 17 are provided for each basic cell array 26. According to the fifth preferred embodiment, it is possible to use a number of select lines 16 half the number of select lines 16 shown in FIG. 7B and use a reduced number of wiring areas 61.

The MOS transistor 18 related to one of the two basic cells 25 of each group has a drain connected to the corresponding monitor point 15, a source connected to one of the two read lines 17, and a gate connected to one of the two select lines 16 related to the group being considered. Similarly, the MOS transistor 18 related to the other basic cell 25 has a drain connected to the corresponding monitor point 15, a source connected to the other read line 17, and a gate connected to the other select line 16. Alternatively, it is also possible to form the gate circuits 60 without forming the select lines 16 and the read lines 17, arrange one or more monitor points 15 for each gate circuit 60 (page 31) and provide the read lines 17 above the basic cells 25.

Referring to FIG. 8, there is illustrated the entire structure of a semiconductor integrated circuit device according to the aforementioned first preferred embodiment of the present invention. The device shown in FIG. 8 has a semiconductor integrated circuit chip 27, logic cells 28, column shaped logic cell arrays 29 and monitor points 30. A test circuit is composed of a timing control circuit 31, a logic cell array selecting circuit 32, array select lines 33, n-channel MOS transistors 34, read lines 35, a sense circuit 36 and a monitor output terminal 37. In FIG. 8, the MOS transistors 34 are illustrated by special symbols for the sake of simplicity. The relationship between the special symbol and a corresponding circuit is illustrated in FIGS. 9A and 9B.

The timing control circuit 31 controls the operation timings of the array select circuit 32 and the sense circuit 36. For this purpose, the timing control circuit 31 generates a clear signal CLR, a clock signal CK, a load signal LD and a load data composed of data D0, D1, D2, ..., as shown in FIG. 10.

Figure 10:
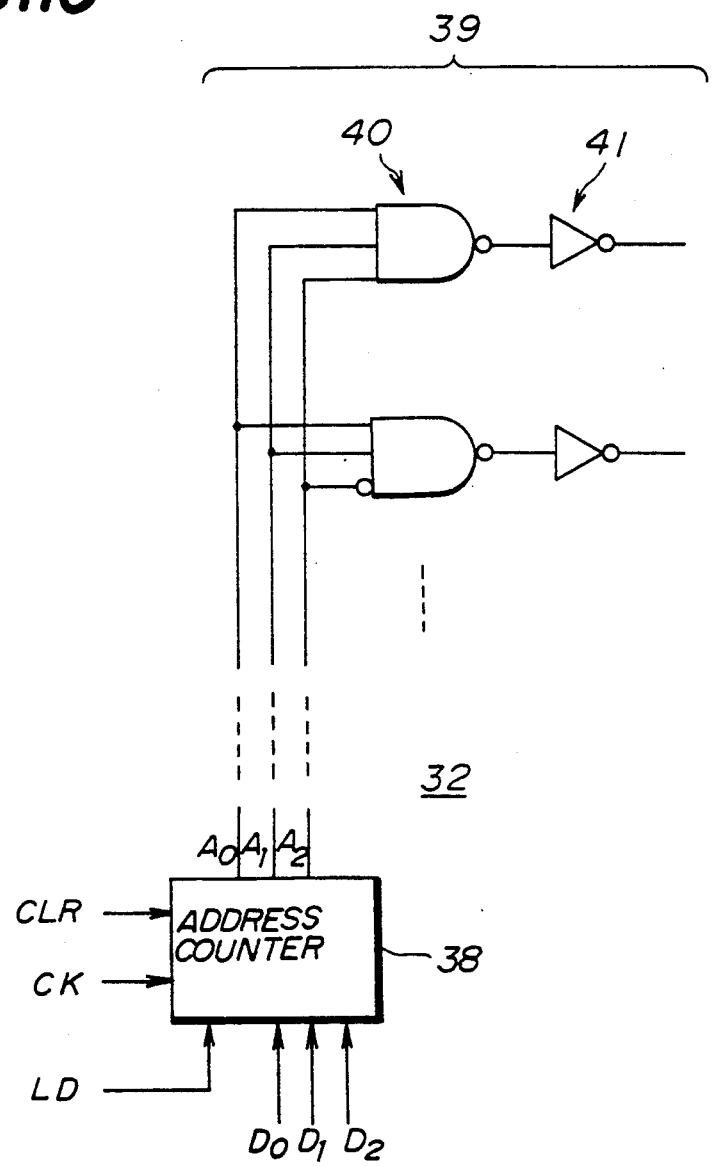
FIG. 10 is a circuit diagram of a column select circuit shown in FIG. 8.

FIG. 10 is a circuit diagram of the array select circuit 32. As shown, the array select circuit 32 is composed of an address counter 38 and an address decoder 39. The address decoder 39 is composed of a group 40 of NAND circuits and a group 41 of inverters. The address counter 38 is cleared by the clear signal CLR, and then starts to count the clock signal CK. Each time the address counter 38 counts the clock signal CK, it outputs an address composed of address bits A0, A1, A2, ..., as shown in FIG. 10. It is also possible to input the load signal LD to the address counter 38 and load the load data D0, D1, D2, ... therein. Thereby, the address counter 38 outputs a special address. The address thus generated is supplied to the group 40 of NAND circuits.

Figure 11:
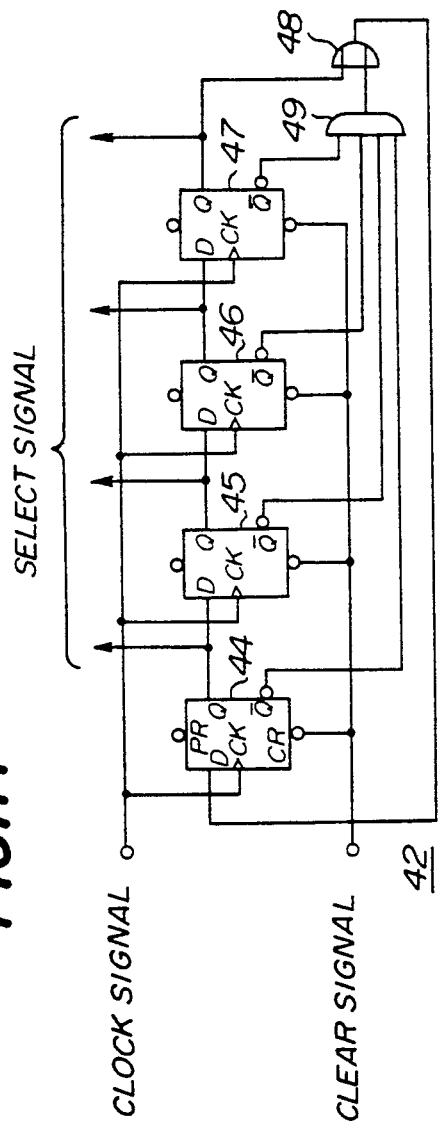
FIG. 11 is a circuit diagram illustrating another configuration of the column select circuit shown in FIG. 8.

Alternatively, it is also possible to configure the array select circuit 32 shown in FIG. 8 by using a ring counter 42 shown in FIG. 11. The ring counter 42 is composed of cascaded D-type flip-flops 44 through 47, an OR circuit 48 and an AND circuit 49. Output terminals $\overline{Q}$ of the flip-flops 44 through 47 are connected to input terminals of the AND circuit 49. An output terminal of the AND circuit 49 is connected to an input terminal of the OR circuit 48, which has an another input terminal connected to the output terminal Q of the flip-flop 47 of the final stage. The output signal generated by the OR circuit 48 is fed back to the flip-flop 44 of the fist stage. The output signals of the flip-flops 44 through 47 are supplied to the array select lines 33.

Figure 12:
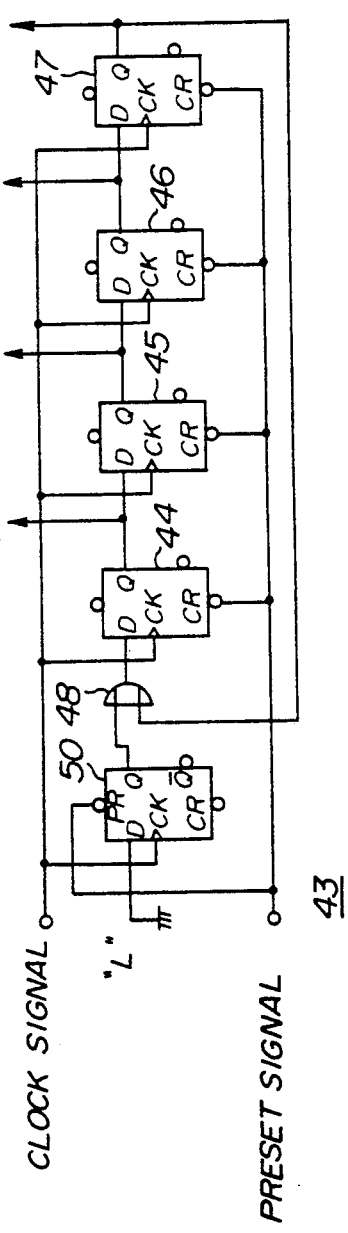
FIG. 12 is a circuit diagram illustrating yet another configuration of the column select circuit shown in FIG. 8.

FIG. 12 illustrates another ring counter 43. In FIG. 12, those parts which are the same as those shown in FIG. 11 are given the same reference numerals. A D-type flip-flop 50 is substituted for the AND circuit 49 shown in FIG. 11.

Figure 13:
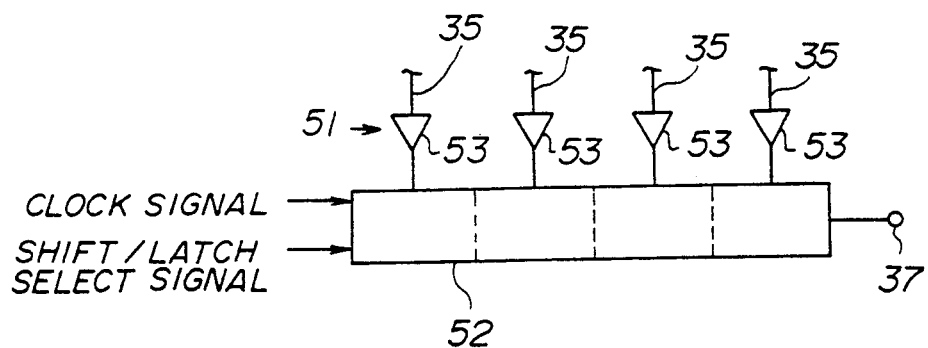
FIG. 13 is a circuit diagram illustrating a sense circuit shown in FIG. 8.

FIG. 13 is a circuit diagram of the sense circuit 36 shown in FIG. 8. The sense circuit 36 in FIG. 8 is composed of a group 51 of sense amplifiers 53 connected to the read lines 35, and a shift register 52. The shift register 52 has a parallel-to-serial conversion function, and has input terminals equal in number to the sense amplifiers 53. The monitor output terminal 37 is connected to an output terminal of the shift register 52. The shift register 52 operates in synchronism with a clock signal and a shift/latch select signal, both of which signals are generated by the timing control circuit 31 shown in FIG. 8.

Figure 14:
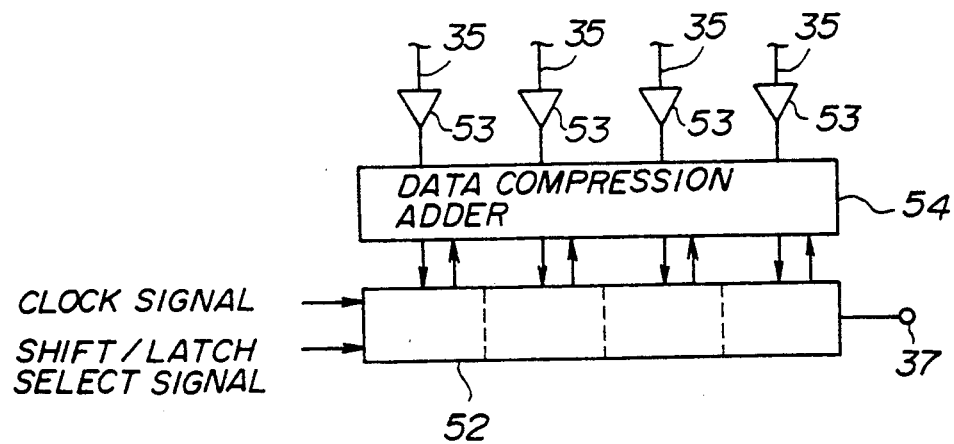
FIG. 14 is a circuit diagram illustrating another configuration of the sense circuit shown in FIG. 8.

The sense circuit 36 is also configured, as shown in FIG. 14. The sense circuit 36 shown in FIG. 14 is composed of sense amplifiers 53, a data compression adder 54 and shift register 52. The data compression circuit 54 is interposed between the sense amplifiers 53 and the shift register 52, and processes the sensed signals from the sense amplifiers 53 in accordance with a data compressed addition procedure.

Figure 15A:
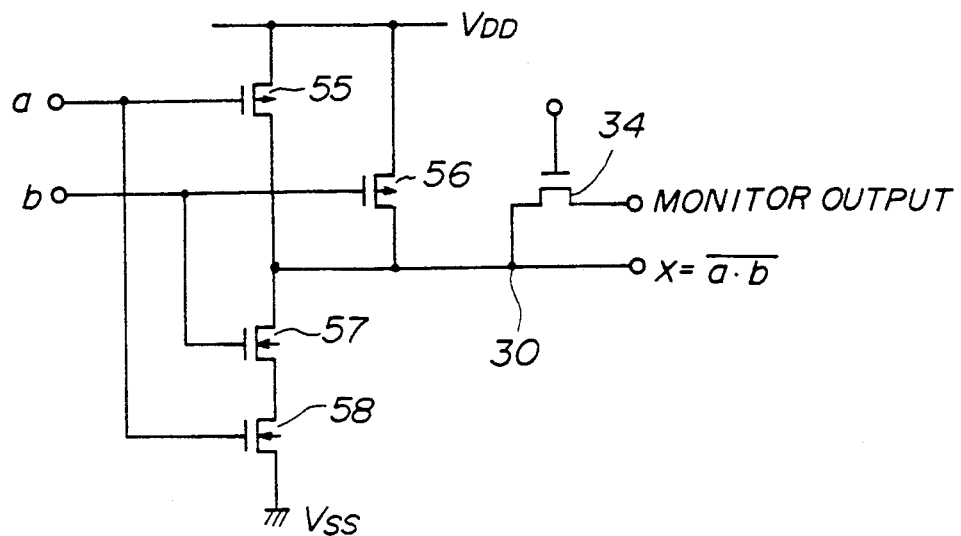
FIGS. 15A and 15B are diagrams illustrating an example of a logic cell used in the embodiments of the present invention.
Figure 15B:
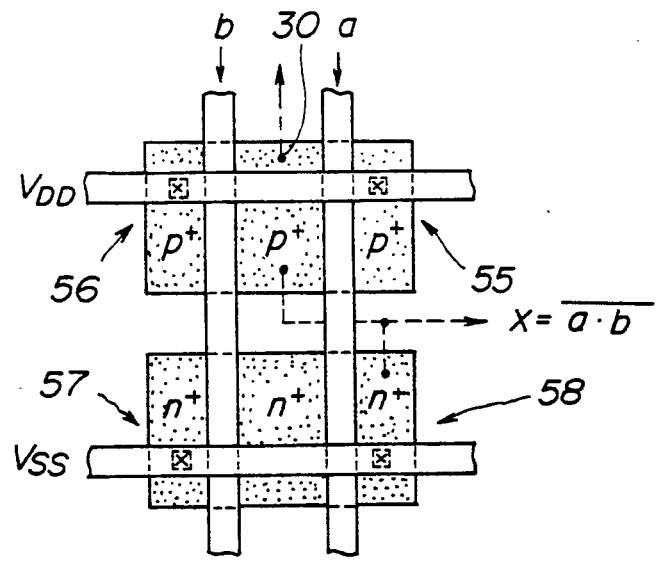

FIG. 15A is a circuit diagram of a two-input NAND circuit which is an example of the logic cells 28, and FIG. 15B is a plan view illustrating a pattern of the circuit shown in FIG. 15A. The NAND circuit shown in FIG. 15A is composed of two p-channel MOS transistors 55 and 56, and two n-channel MOS transistors 57 and 58. An output signal X is obtained by carrying out a NAND operation between two input signals "a" and "b". A monitor output signal is output to the monitor output terminal 37 via a MOS transistor 34. The NAND circuit shown in FIG. 15A is connected between a positive power supply line $V_{DD}$ and a negative power supply line $V_{SS}$.

FIG. 16A is a circuit diagram of a D-type flip-flop which is an example of the logic cells 28. Two monitor points 30 are provided in the flip-flop shown in FIG. 16A. Two monitor output signals are respectively obtained from the monitor points 30 via two n-channel MOS transistors 34. The monitor points 30 are located, as shown in FIG. 16B.

Figure 17A:
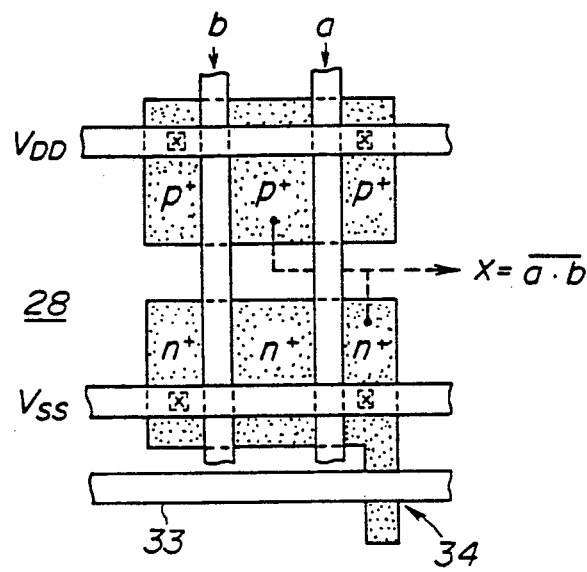
FIGS. 17A and 17B are diagrams illustrating a MOS transistor serving as an switch element.

FIG. 17A illustrates an n-channel MOS transistor 34 functioning as the aforementioned switch element 18. In FIG. 17A, those parts which are the same as those shown in the previous figures are given the same reference numerals. It can be seen from FIG. 17A that the MOS transistor 34 is fabricated as a part of the logic cell 28.

Figure 17B:
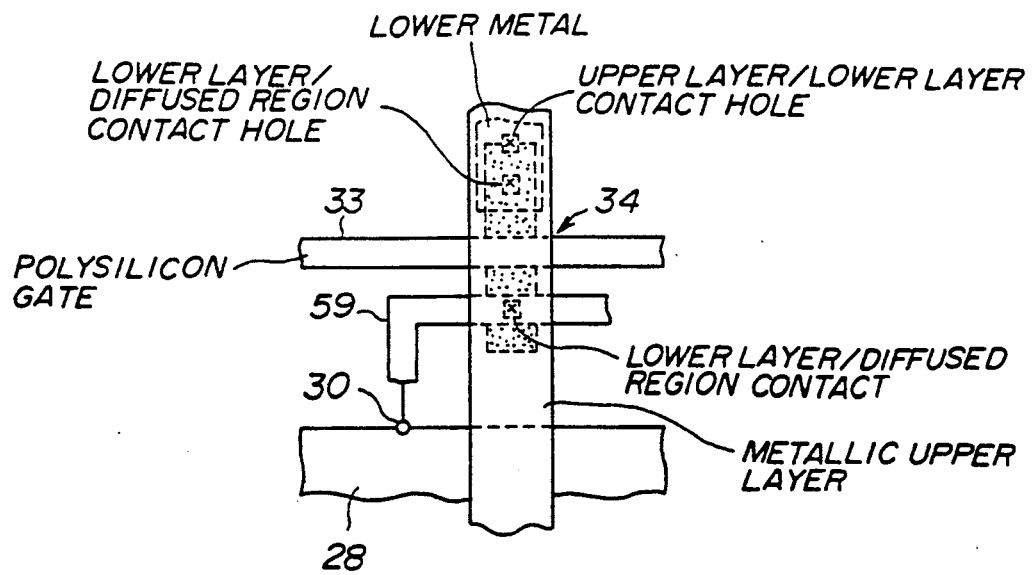

FIG. 17B illustrates an arrangement in which the MOS transistor 34 is fabricated separately from the logic cell 28. The monitor point 30 of the logic cell 28 is connected to the MOS transistor 34 via a metallic lower layer 59 used for mutually connecting logic cells. This arrangement realizes the wiring efficiently and provides a large degree of freedom to route interconnection lines provided for mutually connecting the logic cells 28. For example, it is possible to position the MOS transistor at an optimum point so that the read line 35 runs straight without being bent. This increases the degree of freedom to route the interconnection lines.

Figure 18:
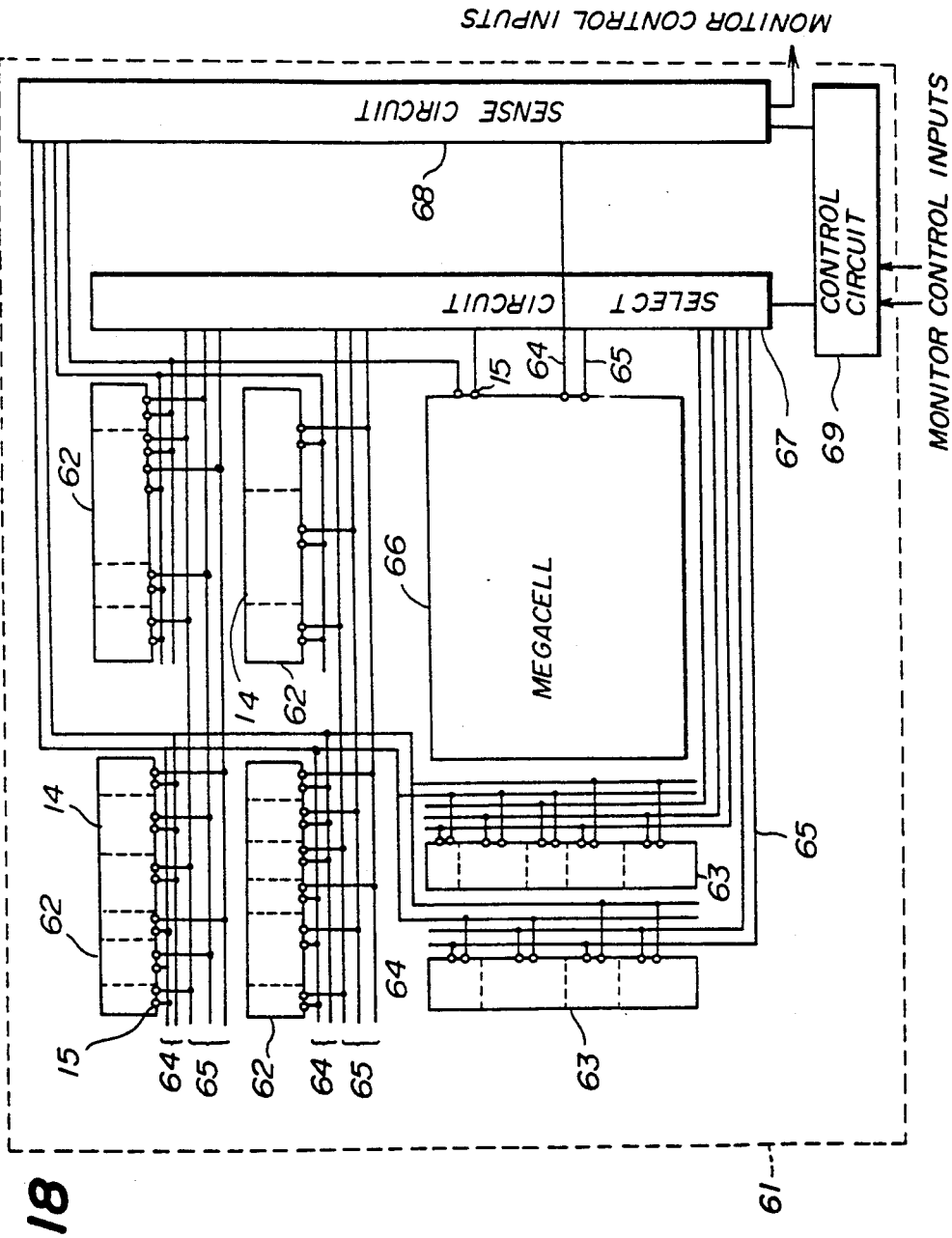
FIG. 18 is a block diagram illustrating a sixth embodiment of the present invention.

A description will be given of a sixth preferred embodiment of the present invention with reference to FIG. 18. A semiconductor integrated circuit device shown in FIG. 18 is composed of column shaped logic cell arrays 62 and 63, read lines 64, select lines 65, a megacell 66 a select circuit 67, a sense circuit 68 and a control circuit 69. The logic cell arrays 62 run in the transversal direction, and the logic cell arrays 63 run in the direction perpendicular to the transversal direction. The read lines 64 and the select lines 65 run along the logic cell arrays 62 and 63. This arrangement is different from the aforementioned embodiments of the present invention. The read lines 64 are connected to the sense circuit 68, and the select lines 65 are connected to the select circuit 67. Although switch elements, such as the MOS transistors 18, are connected between the read lines 64 and the monitor points 15, these switch elements are not shown for the sake of simplicity. The read lines 64 and the select lines 65 are bent at ends of the logic cell arrays 62 and 63 so that these lines run around the megacell 66. The read lines 64 related to the logic cell arrays 62 on the left side of the drawing and the logic cell arrays 63 are mutually connected.

The megacell 66 is a block shaped circuit including a memory and an analog circuit such as a multiplier. The megacell 66 has at least one monitor point 15, which is connected to the sense circuit 68 via the read line 64. The megacell 66 is also connected to the select circuit 67 via the select line 65. The control circuit 69 inputs monitor control signals from an external circuit, and controls the select circuit 67 and the sense circuit 68. A monitor output signal is output from the sense circuit 68.

Figure 19:
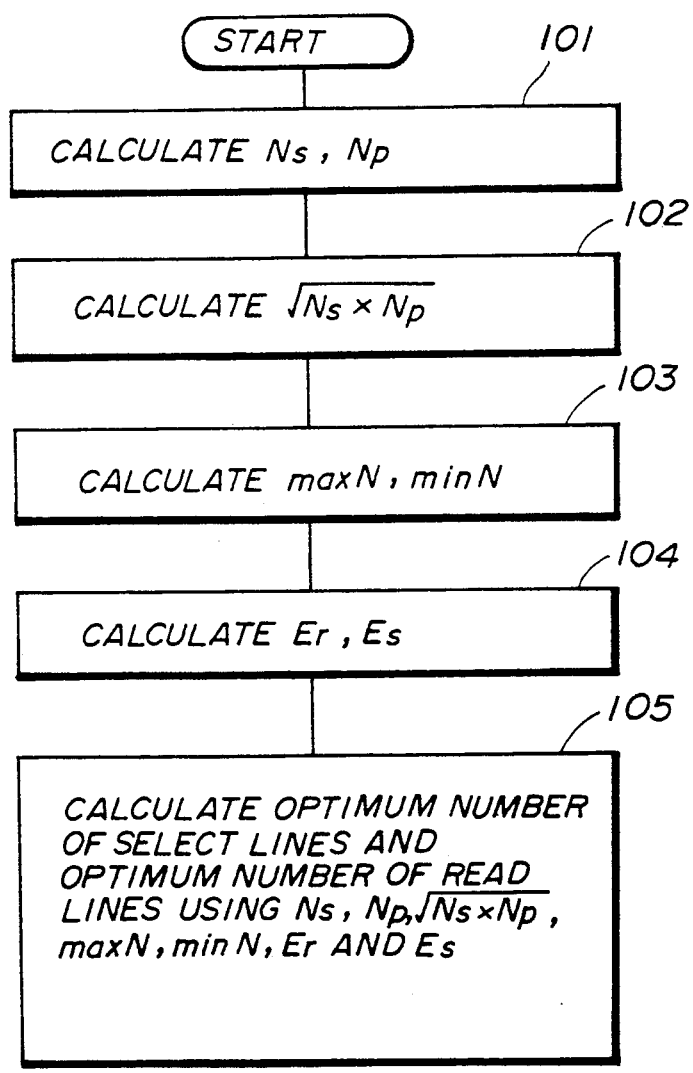
FIG. 19 is a flowchart of a procedure for obtaining an optimum number of read lines and an optimum number of select lines.

FIG. 19 illustrates a computer-implemented procedure showing how to obtain an optimum number of read lines and an optimum number of select lines, for example, in the arrangement shown in FIG. 2A. At step 101, the number of read lines, Ns, and the number of select lines, Np, obtained by the aforementioned prior art as shown in FIG. 2B are calculated. At step 102, $\sqrt{Ns \times Np}$ is calculated. Step 103 investigates the distribution of monitor points where the monitoring is required for each column shaped logic cell array, and obtains the maximum number of monitor points, maxN, and the minimum number of monitor points, minN. At step 104, weighting functions, Er and Es, showing that the routing of read and select lines affects the layout area on the chip. At step 105 the optimum number of read lines and the optimum number of select lines are calculated by using the results obtained at steps 101, 102, 103 and 104.

The present invention is not limited to the specifically disclosed embodiments, and variations and modifications may be made without departing from the scope of the present invention.

What is claimed is:

1. A circuit arrangement of a semiconductor integrated circuit device comprising:
   logic cell arrays arranged into columns, each of the logic cell arrays having a plurality of logic cells, each of said logic cells having at least one monitor point;
   select lines carrying select signals, each specifying a corresponding one of said logic cell arrays;
   read lines carrying monitor signals showing logic states of monitor points of said logic cells, said select lines and said read lines being provided so that the total number of said select lines and read lines is less than the sum total of the number of said logic cell arrays and a maximum number of monitor points contained in one of said logic cell arrays; and
   switch elements connecting the monitor points of said logic cells to said read lines in response to said select signals.

2. A circuit arrangement as claimed in claim 1, wherein:
   each of said logic cell arrays runs in a first direction;
   said select lines run in the first direction;
   said read lines run in a second direction perpendicular to the first direction;
   the number of select lines for each of said logic cell arrays is half the number of monitor points of a corresponding one of the logic cell arrays or its nearest whole number; and
   the total number of read lines is half said maximum number of monitor points or its nearest whole number.

3. A circuit arrangement as claimed in claim 1, wherein:
   each of said logic cell arrays runs in a first direction;
   said read lines run in the first direction;
   said select lines run in a second direction perpendicular to the first direction;
   the number of read lines for each of said logic cell arrays is half the number of monitor points of a corresponding one of the logic cell arrays or its nearest whole number; and
   the total number of select lines is half said maximum number of monitor points or its nearest whole number.

4. A circuit arrangement as claimed in claim 1, wherein:
   each of said logic cell arrays runs in a first direction;
   said select lines run in the first direction;
   said read lines run in a second direction perpendicular to the first direction;
   said logic cell arrays include a first logic cell array having a first monitor point and a second monitor point;
   said select lines include a first select line and a second select line provided for said first logic cell array;

said read lines includes a first read line provided for said first logic cell array;

said switch elements include a first transistor selected by said first select line and a second transistor selected by said second select line;

said first monitor point is coupled to said first read line via said first transistor; and said second monitor point is coupled to said first read line via said second transistor.

5. A circuit arrangement as claimed in claim 1, wherein:

each of said logic cell arrays runs in a first direction;

said read lines run in the first direction;

said select lines run in a second direction perpendicular to the first direction;

said logic cell arrays include a first logic cell array having a first monitor point and a second monitor point;

said read lines include a first read line and a second read line provided for said first logic cell array;

said select lines includes a first select line provided for said first logic cell array;

said switch elements include a first transistor selected by said first select line and a second transistor selected by said first select line;

said first monitor point is coupled to said first read line via said first transistor; and said second monitor point is coupled to said second read line via said second transistor.

6. A circuit arrangement as claimed in claim 1, wherein said select lines are more than said logic cell arrays.

7. A circuit arrangement as claimed in claim 1, wherein said read lines are more than said logic cell arrays.

8. A circuit arrangement as claimed in claim 1, wherein:

said logic cell arrays include a first logic cell array and a second logic cell array which are positioned side by side in a first direction;

said select lines and said read lines respectively have select lines and read lines, both of which lines run in the first direction; and said select lines provided for said first and second logic cell arrays are provided in common for said first and second logic cell arrays.

9. A circuit arrangement as claimed in claim 8, wherein:

said logic cell arrays include a third logic cell array which runs in a second direction perpendicular to the first direction;

said read lines and said select lines respectively have read lines and select lines which are provided for said third logic cell array and which run in said second direction; and said read lines provided for said first, second and third logic cell arrays are provided in common for said first, second and third logic cell arrays.

10. A circuit arrangement as claimed in claim 1, further comprising a megacell, wherein said select lines and said read lines are routed so as to run around said megacell.

11. A circuit arrangement of a semiconductor integrated circuit device comprising:

a first group of logic cell arrays arranged into columns, each of said logic cell arrays running in a first direction;

a second group of logic cell arrays arranged into columns, each of said logic cell arrays of said second groups running in a second direction perpendicular to the first direction, said first and second groups being positioned side by side in one of said first and second directions, each of said logic arrays of said first and second groups having a plurality of logic cells, and each of said logic cells having at least one monitor point;

a first group of select lines provided for said first group of logic cell arrays, said select lines carrying select signals, each specifying a corresponding one of said logic cell arrays, the number of select lines of said first group being larger than the number of said logic cell arrays of said first group;

a first group of read lines provided for said first group of logic cell arrays, said read lines of said first group carrying monitor signals showing logic states of monitor points of said logic cells of said first group of logic cell arrays;

a second group of select lines provided for said second group of logic cell arrays, said select lines of said second group carrying select signals, each specifying a corresponding one of said logic cell arrays of said second group;

a second group of read lines provided for said second group of logic cell arrays, said read lines of said second group carrying monitor signals showing logic states of monitor points of said logic cells of said second group of logic cell arrays, the number of said read lines of said second group being larger than that of said logic cell arrays of said second group;

a first group of switch elements connecting the monitor points of the logic cells of said first group of logic cell arrays to said first group of read lines in response to said select signals carried by said first group of select lines; and a second group of switch elements connecting the monitor points of the logic cells of said second group of logic cell arrays to said second group of read lines in response to said select signals carried by said second group of select lines.

12. A circuit arrangement as claimed in claim 11, wherein said first group of logic cell arrays and said second group of logic cell arrays are positioned side by side in the first direction, and said first group of select lines are coupled to said second group of select lines.

13. A circuit arrangement, as claimed in claim 11, wherein said first group of logic cell arrays and said second group of logic cell arrays are positioned side by side in the second direction, and said first group of read lines are coupled to said second group of read lines.

14. A circuit arrangement as claimed in claim 11, wherein the number of select lines for each of said first group of logic cell arrays is half the number of monitor points of a corresponding one of the logic cell arrays of said first group or its nearest whole number; and the total number of read lines of said first group is half the number of monitor points of a maximum number of monitor points contained in one of said logic cell arrays of said first group or its nearest whole number.

15. A circuit arrangement as claimed in claim 11, wherein the number of read lines for each of said second group of logic cell arrays is half the number of monitor points of a corresponding one of the logic cell arrays of said second group or its nearest whole number.

16. A circuit arrangement of a semiconductor integrated circuit device, comprising:

basic cell arrays arranged into columns, each basic cell array having a plurality of basic cells, each of said basic cells having one monitor point, and each of said basic cells having an identical pattern;

a plurality of select lines respectively provided for each of said basic cell arrays and carrying select signals for specifying a corresponding one of said basic cells arrays, said number of select lines being less than the number of logic cell arrays and maximum number of monitor points contained in one of said logic cells arrays;

a plurality of read lines carrying monitor signals showing logic states of monitor points of said basic cells, said number of read lines being less than the number of logic cell arrays and maximum number of monitor points contained in one of said logic cell arrays; and switch elements connecting the monitor points of said basic cells to said read lines in response to said select signals.

17. A circuit arrangement as claimed in claim 16, wherein:

each of said basic cell arrays runs in a first direction;
said select lines run in the first direction;
said read lines run in a second direction perpendicular to the first direction;
said basic cell arrays include a basic cell array having a group of first and second basic cells;
said select lines include first and second select lines related to said basic cell array having said first and second basic cells;
said read lines include first and second read lines related to said basic cell array having said first and second basic cells;
said switch elements include first and second transistors respectively provided for said first and second basic cells respectively connected to said first and second select lines;
the monitor point of said first basic cell is coupled to said first read line via said first transistor; and
the monitor point of said second basic cell is coupled to said read line via said second transistor.

18. A circuit arrangement as claimed in claim 16, wherein:

each of said basic cell arrays runs in a first direction;
said read lines run in the first direction;
said select lines run in a second direction perpendicular to the first direction;
said basic cell arrays include a basic cell array having a group of first and second basic cells;
said select lines include first and second select lines related to said basic cell array having said first and second basic cells;
said read lines include first and second read lines related to said basic cell array having said first and second basic cells;
said switch elements include first and second transistors respectively provided for said first and second basic cells respectively connected to said first and second select lines;
the monitor point of said first basic cell is coupled to said first read line via said first transistor; and
the monitor point of said second basic cell is coupled to said second read line via said second transistor.

* * * * *